(12) United States Patent
Luu

(10) Patent No.: US 6,639,462 B1
(45) Date of Patent: Oct. 28, 2003

(54) DIGITAL AM TRANSMITTER HAVING TRACKING POWER SUPPLY COMPENSATION

(75) Inventor: Ky Thoai Luu, Mason, OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 10/184,315

(22) Filed: Jun. 27, 2002

(51) Int. Cl.[7] ............................................. H03F 1/14
(52) U.S. Cl. ................................ 330/51; 330/297
(58) Field of Search ........................... 330/51, 124 R, 330/297, 84, 295

(56) References Cited

U.S. PATENT DOCUMENTS

| 4,580,111 A | 4/1986 | Swanson |
|---|---|---|
| 4,949,050 A | 8/1990 | Swanson |
| 6,208,203 B1 * | 3/2001 | Jung et al. .................. 330/51 |
| 6,294,955 B1 * | 9/2001 | Luu et al. .................... 330/51 |
| 6,373,340 B1 * | 4/2002 | Shashoua .................... 330/297 |
| 6,445,248 B1 * | 9/2002 | Gilbert ........................ 330/51 |

* cited by examiner

Primary Examiner—Henry Choe
(74) Attorney, Agent, or Firm—Tarolli, Sundheim, Covell & Tummino L.L.P.

(57) ABSTRACT

An AM transmitter having tracking power supply compensation. A first power supply provides a constant DC operating voltage. A second power supply is responsive to an input signal, such that the second power supply provides a DC voltage when an amplitude associated with the input signal exceeds a predetermined level. N RF amplifiers amplify the input signal. Each of the plurality of amplifiers are connected to the first and second power supplies. Each of the amplifiers has an output circuit that, when the associated amplifier is on, supplies energy from the first and second power supplies to provide an output voltage to a load.

16 Claims, 4 Drawing Sheets

US 6,639,462 B1

DIGITAL AM TRANSMITTER HAVING TRACKING POWER SUPPLY COMPENSATION

BACKGROUND OF THE INVENTION

1. Technical Field

This invention relates to the art of radio broadcasting and, more particularly, to an AM (amplitude modulation) transmitter with a tracking power supply for its amplifiers.

2. Description of the Prior Art

The U.S. Patents to H. I. Swanson U.S. Pat. No. 4,580,111 and 4,949,050 disclose an amplitude modulator for use in AM radio broadcasting and wherein the modulator serves to generate an amplitude modulated signal by selectively turning on and off a plurality of RF amplifiers in digital manner to produce amplitude modulation. Each of the RF amplifiers provides an output voltage across the primary winding of a transformer. The secondary windings of the transformers are connected together in series in a series combiner. Output current flows in the secondary windings to supply a load, such as an antenna, for broadcasting an RF signal.

In a system as noted above, the level of modulation attainable by the transmitter is limited by the number of amplifiers in the system. While the level of modulation can be increased by adding additional amplifiers to the system, this constitutes an added expense in the system design. The added expense is especially unfortunate, given the fact that the new amplifiers will be needed only for the occasional peak signal. Often, the additional amplifiers will contribute only a small amount to the average power output of the transmitter. This is an inefficient use of the design of the amplifier that unnecessarily increases the expense of the transmitter system.

SUMMARY OF THE INVENTION

In accordance with one aspect of the present invention, an AM transmitter is disclosed with tracking power supply compensation. A first power supply provides a constant DC operating voltage. A second power supply is responsive to an input signal, such that the second power supply provides a DC voltage when an amplitude associated with the input signal exceeds a predetermined level. N RF amplifiers amplify the input signal. Each of the plurality of amplifiers are connected to the first and second power supplies. Each of the amplifiers has an output circuit that, when the associated amplifier is on, supplies energy from the first and second power supplies to provide an output voltage to a load.

In accordance with another aspect of the present invention, an AM transmitter is disclosed with tracking power supply compensation. A first power supply provides a constant DC operating voltage. A second power supply is responsive to an input signal, such that the second power supply provides a DC voltage when an amplitude associated with the input signal exceeds a predetermined level. N RF amplifiers amplify the input signal. Each of the plurality of amplifiers are connected to the first and second power supplies. Each of the amplifiers has an output circuit that, when the associated amplifier is on, supplies energy from the first and second power supplies to provide an output voltage to a load. A controller selectively turns on one or more of the N amplifiers with the number that are turned on being a function of the input signal.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF THE PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated in the aforesaid U.S. Pat. No. 4,580,111 which is assigned to the same assignee as the present invention and the disclosure of that patent is herein incorporated by reference.

Figure 1:
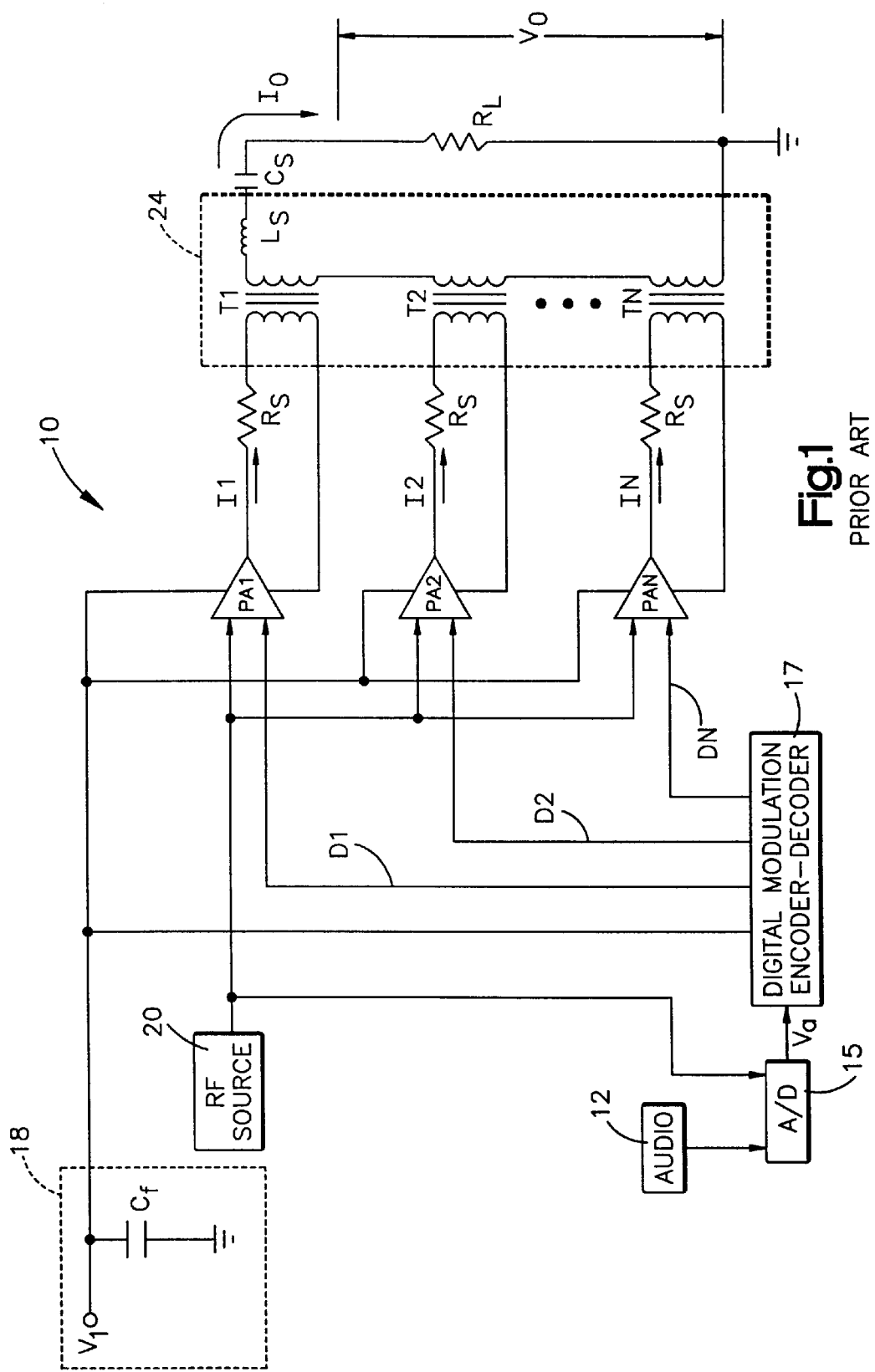
FIG. 1 is a prior art schematic-block diagram illustration of one application to which the present invention may be applied.

Referring now to FIG. 1, the amplitude modulator 10 is illustrated as receiving an input signal from an input source 12, which may be the source of an audio signal. Modulator 10 amplitude modulates an RF carrier signal with the input signal. The modulation is a function of the amplitude of the input signal. The amplitude modulated carrier signal is provided on an output line connected to a load $R_L$, which may take the form of an RF transmitting antenna. A controller including a modulation encoder 17 provides a plurality of digital control signals D1–DN. The control signals are binary signals each having a binary 1 or a binary 0 level. The number of signals having binary 1 or binary 0 levels is dependent upon the instantaneous level of the input signal which is digitized by an analog to digital converter 15. Thus, the greater the input signal the more control signals having a binary 1 level.

Each of the control signals D1–DN is supplied to one of a plurality of N RF power amplifiers PA1–PAN, powered by a constant power supply 18. The control signals serve to turn associated power amplifiers either on or off. Thus, if the control signal has a binary 0 level, then its associated amplifier is inactive and no signal is provided at its output. However, if the control signal is of a binary 1 level, then the power amplifier is active and the amplified carrier signal is provided as its output.

Each power amplifier has an input connected to the signal common RF source 20 so that each amplifier PA1–PAN, when on, receives a signal of like amplitude and phase and frequency. The carrier signals may be square waves. The outputs of the power amplifier are supplied to a combiner circuit 24 comprised of a plurality of transformers T1, T2 . . . TN. The secondary windings act as an independent signal source, whereby the signals provided by the various transformers additively combine with one another to produce a combined signal which is supplied to the load $R_L$. This combined signal has the same frequency as the RF signal supplied by the RF source 20, but the amplitude of the combined signal is modulated in accordance with the input signal supplied by the input source 12.

While the transmitter is operating, some of the power amplifiers PA–PAN are turned on. This is represented in FIG. 1 wherein the currents I1, I2 . . . IN are flowing in the primary windings of transformers T1, T2 . . . TN. Current flowing in the primary windings causes current to be induced in the secondary windings providing a combined output current $I_o$ that flows through the load $R_L$ providing an output voltage $V_o$.

Figure 2:
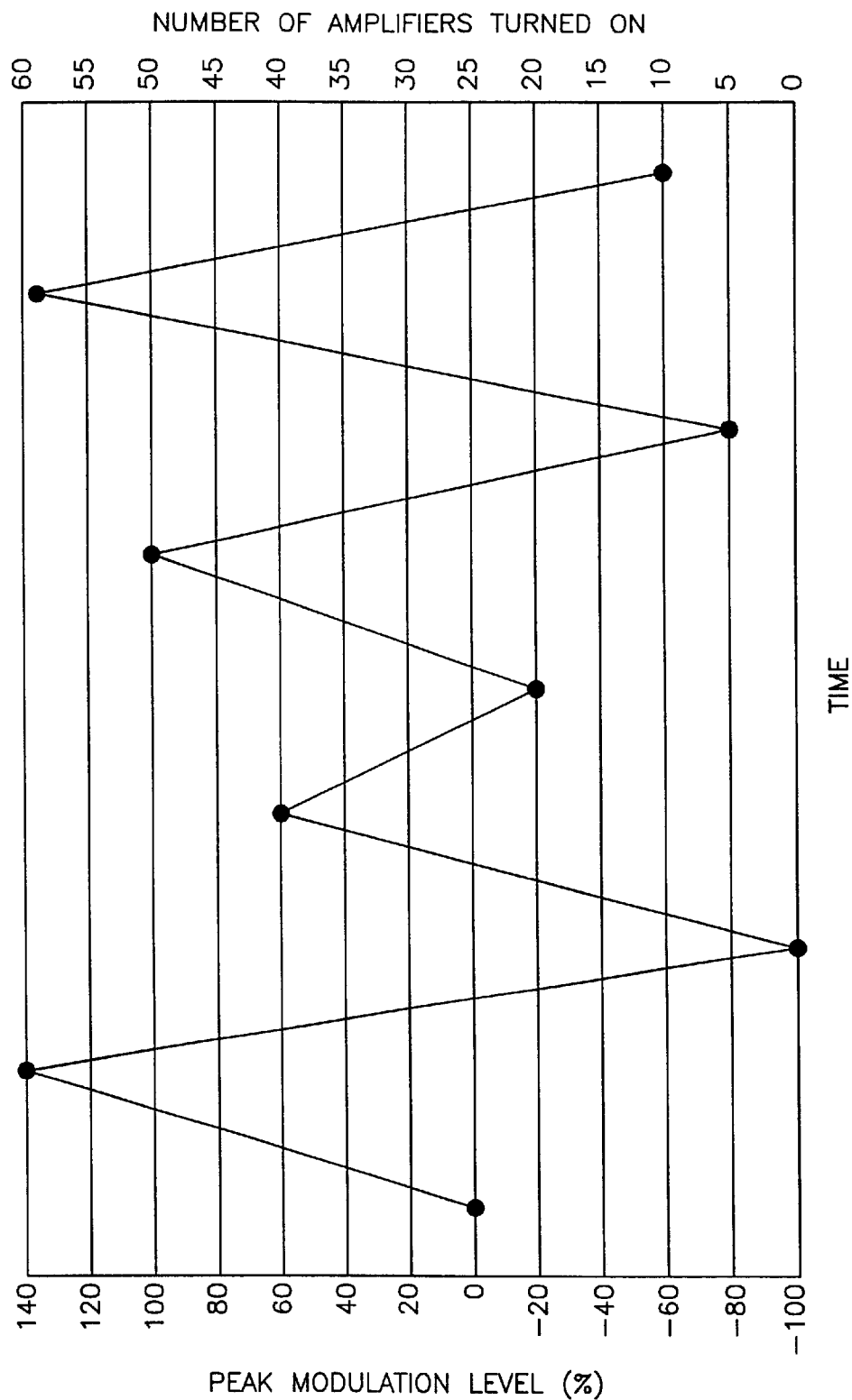
FIG. 2 is a graphical illustration of the peak modulation level of a prior art transmitter and the number of power amplifiers employed to effect that level of modulation displayed across a period of time.

FIG. 2 illustrates, solely for the purpose of example, a random waveform with sixty power amplifiers and a maximum peak modulation level of one-hundred and forty percent modulated by a prior art system. The graphical illustration of FIG. 2 assumes that twenty-five transmitters are required to broadcast the unmodulated carrier signal. As can be seen in the figure, several of the power amplifiers are rarely active. For example, power amplifiers 49–60 are activated only when the system reaches the very highest levels of modulation and are idle the remainder of the time. In practice, the top twenty percent of the amplifiers (amplifiers 49–60) in a prior art system such as this may contribute less than four-tenths of a percent of the average power output of the system. Clearly, this is an inefficient use of these components.

Figure 3:
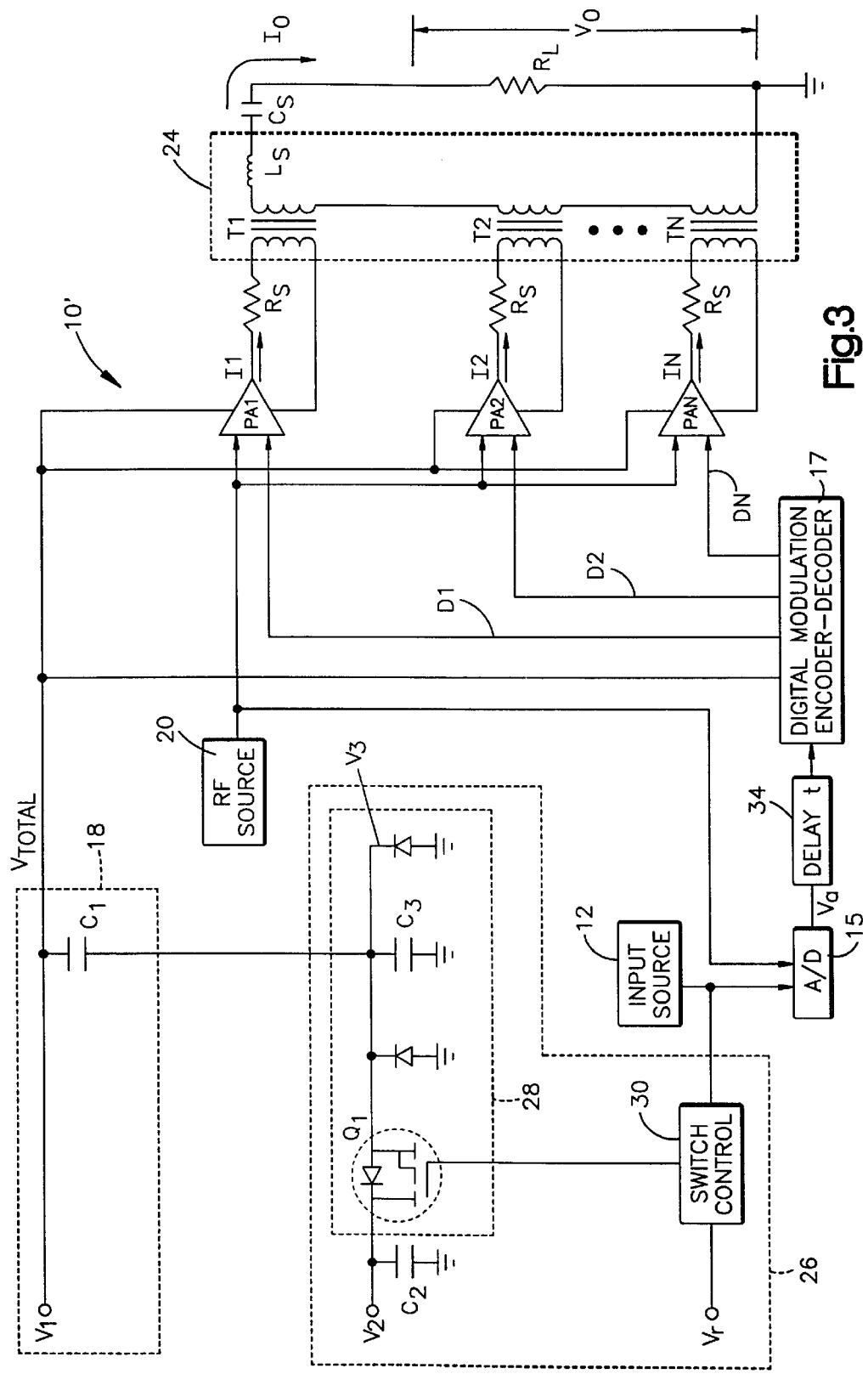
FIG. 3 is a schematic-block diagram illustration in accordance with the present invention.

The embodiment illustrated in FIG. 3 is similar to that as illustrated in FIG. 1 and to simplify the description herein, like components in FIGS. 1 and 3 are identified with like character references. Only the differences between FIGS. 1 and 3 will be described below in detail.

The transmitter 10' in FIG. 3 includes a second power supply 26. The second power supply 26 provides additional power to the amplifiers PA1–PAN when the input signal reaches a threshold level, represented by a reference voltage $V_r$. In the example embodiment, the additional power is provided to the amplifiers when an output level is required that cannot be generated by the amplifiers with the power supplied by a first power supply 18. The second power supply 26 tracks the difference between the reference voltage and the input signal and provides an additional voltage $V_3$, to the amplifiers in proportion to that difference. This voltage, in combination with the voltage $V_1$ provided by the first power supply 18, supplies sufficient power to the amplifiers to allow for the desired level of peak modulation.

The second power supply includes a constant voltage source $V_2$ connected in series to a buck converter 28. The buck converter 28 transforms the constant voltage into the desired voltage $V_3$. A switch control 30 receives the input signal from the input source 12 and compares it to the reference voltage. Where the input signal exceeds the reference voltage, the switch control 30 operates a transistor switch Q1 within a buck converter 28 according to the amplitude of the input signal. As is known in the art, the voltage $V_3$ outputted from the buck converter 28 is regulated by the operation of the transistor switch.

The tracking transmitter of FIG. 3 also contains a delay "t" network 34 connected in series between the analog/digital converter 15 and the digital modulation encoder-decoder 17. This network delays the signal to the digital modulation encoder-decoder 17 when the input signal exceeds the reference value $V_r$. This allows the second power supply 26 sufficient time to determine an appropriate voltage, produce the desired voltage via the buck converter 28, and provide the additional power to the amplifiers PA1–PAN. The delay "t" network is selected to have the same group delay as that created by the components L1 and C3 of the buck converter 28.

Figure 4:
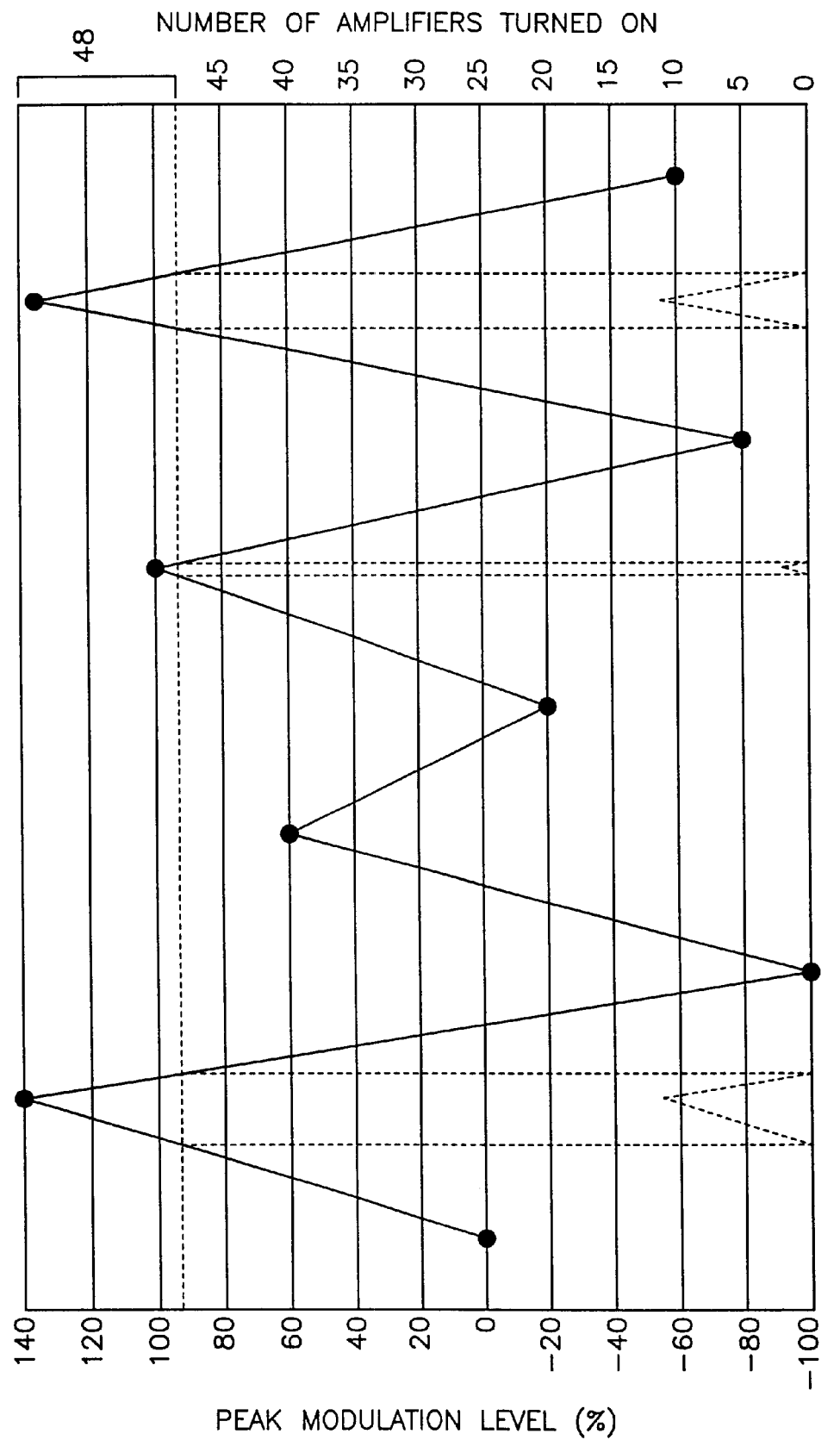
FIG. 4 is a graphical illustration of the peak modulation level of a transmitter in accordance with the present invention and the number of power amplifiers employed to effect that level of modulation displayed across a period of time.

FIG. 4 illustrates, solely for the purpose of example, a random waveform with sixty power amplifiers and a maximum peak modulation level of one-hundred and forty percent modulated by the present invention. Again, the graphical illustration assumes that twenty-five transmitters are required to broadcast the unmodulated carrier signal. As is shown in the figure, the present invention requires significantly fewer amplifiers than the prior art system. The additional of the tracking power supply allows for the elimination of excess amplifiers, decreasing the overall cost of the system. It should be noted that the twenty percent reduction illustrated here is merely shown as an example. Larger reductions in the number of amplifiers are practical and within the scope of the present invention.

Although the invention has been described in conjunction with a preferred embodiment, it is to be appreciated that various modifications may be made without departing from the spirit and scope of the invention as defined by the appended claims.

Having described the invention, I claim:

1. An AM transmitter with tracking power supply compensation, comprising:

a first power supply that provides a constant DC operating voltage;

a second power supply that provides a DC voltage, the second power supply including a controller that compares the input signal to a threshold voltage and determines an appropriate value for the provided voltage according to the comparison; and a plurality of RF amplifiers that provide an amplified representation of the input signal, each of the plurality of amplifiers being connected to the first and second power supplies and having an output circuit that, when the associated amplifier is on, supplies energy from the first and second power supplies to provide an output voltage to a load.

2. An AM transmitter as set forth in claim 1, including a controller that selectively turns on one or more of the N power amplifiers with the number that are turned on being a function of the input signal.

3. An AM transmitter as set forth in claim 2, wherein the controller turns on one or more of the amplifiers in direct proportion to the value of the input signal.

4. An AM transmitter as set forth in claim 2, wherein the controller turns on a number of amplifiers in linear relationship to the value of the input signal.

5. An AM transmitter as set forth in claim 1, wherein the second power supply includes a buck converter that regulates the DC voltage produced by the second power supply.

6. An AM transmitter as set forth in claim 2, including a time delay circuit that delays the introduction of the input signal to the controller.

7. An AM transmitter as set forth in claim 1, wherein the output voltage determined by the power supply controller is proportional to the difference between the amplitude of the input signal and the reference voltage.

8. A transmitter with tracking power supply compensation, comprising:

at least one amplifier that provides an amplified representation of an input signal;

a first power supply that provides a constant DC operating voltage to the amplifier;

a second power supply that outputs a variable DC voltage to the amplifier, the second power supply including a controller that compares the input signal to a threshold voltage and determines an appropriate value for the output voltage according to the comparison.

9. A transmitter as set forth in claim 8, wherein the output voltage determined by the power supply controller is proportional to the difference between the amplitude of the input signal and the reference voltage.

10. An AM transmitter with tracking power supply compensation, comprising:
- a plurality of amplifiers, connected in parallel to a common load, that provide an amplified representation of an input signal to the load;
- a first power supply that provides a constant voltage to each of the plurality of amplifiers;
- a controller that selectively actuates a number of the RF amplifiers; and
- a second power supply that provides an additional voltage to each of the plurality of amplifiers only when the input signal exceeds a threshold voltage.

11. An AM transmitter as set forth in claim 10, wherein number of amplifiers actuated by the controller varies in direct proportion to the amplitude of the input signal.

12. An AM transmitter as set forth in claim 10, wherein number of amplifiers actuated by the controller varies linearly with the amplitude of the input signal.

13. An AM transmitter as set forth in claim 10, wherein the second power supply includes a buck converter that regulates the voltage produced by the second power supply.

14. An AM transmitter as set forth in claim 10, including a time delay circuit that delays the introduction of the input signal to the controller.

15. An AM transmitter as set forth in claim 10, wherein the second power supply includes a controller that compares the amplitude of an input signal to a reference voltage to determine an appropriate output voltage for the second power supply.

16. An AM transmitter as set forth in claim 15, wherein the output voltage determined by the power supply controller is proportional to the difference between the amplitude of the input signal and the reference voltage.

* * * * *